(12) United States Patent
Matsui et al.

(10) Patent No.: US 10,327,324 B2
(45) Date of Patent: Jun. 18, 2019

(54) CIRCUIT BOARD

(71) Applicant: Panasonic Intellectual Property Management Co., Ltd., Osaka (JP)

(72) Inventors: Nobuyuki Matsui, Fukushima (JP); Makoto Ohno, Mie (JP); Hiroyuki Yamada, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 63 days.

(21) Appl. No.: 15/308,601

(22) PCT Filed: May 14, 2015

(86) PCT No.: PCT/JP2015/002443
§ 371 (c)(1),
(2) Date: Nov. 2, 2016

(87) PCT Pub. No.: WO2015/177993
PCT Pub. Date: Nov. 26, 2015

(65) Prior Publication Data
US 2017/0142821 A1  May 18, 2017

(30) Foreign Application Priority Data

May 22, 2014  (JP) ................................ 2014-105867

(51) Int. Cl.
*H05K 1/02* (2006.01)
*H05K 1/18* (2006.01)
(Continued)

(52) U.S. Cl.
CPC ........... *H05K 1/0204* (2013.01); *H01L 23/36* (2013.01); *H05K 1/0313* (2013.01); *H05K 1/181* (2013.01);
(Continued)

(58) Field of Classification Search
CPC .. H05K 1/0204; H05K 1/0206; H05K 1/0207; H05K 2201/066; H05K 1/0201;
(Continued)

(56) References Cited

U.S. PATENT DOCUMENTS 7,872,869 B2 *  1/2011  Lee .................... H01L 23/3677
                                                    361/704
9,930,769 B2 *  3/2018  Mittal ................. H05K 1/0204
(Continued)

FOREIGN PATENT DOCUMENTS

| JP | 2007-019125 | 1/2007 |
| JP | 2010-263003 | 11/2010 |
| JP | 2011-159546 | 8/2011 |

OTHER PUBLICATIONS

International Search Report of PCT application No. PCT/JP2015/002443 dated Jun. 9, 2015.
(Continued)

*Primary Examiner* — Steven T Sawyer
*Assistant Examiner* — Paresh H Paghadal
(74) *Attorney, Agent, or Firm* — McDermott Will & Emery LLP

(57) ABSTRACT

A circuit board includes a heat storage body, an insulating layer provided on the heat storage body, a wiring board provided on the insulating layer, and a heat generating component provided on the wiring board. The insulating layer is provided independently of the wiring board. The wiring board is provided with a heat transfer metal portion penetrating through the wiring board and facing the heat generating component. The insulating layer is provided with a heat transfer resin portion penetrating through the insulating layer and facing the heat transfer metal portion. The heat (Continued)

transfer resin portion and a part of the insulating layer are interposed between the heat transfer metal portion and the heat storage body.

3 Claims, 5 Drawing Sheets

(51) Int. Cl.
*H05K 1/03* (2006.01)
*H01L 23/36* (2006.01)
*H01L 23/367* (2006.01)
*H05K 3/00* (2006.01)

(52) U.S. Cl.
CPC .. *H01L 23/3677* (2013.01); *H01L 2924/0002* (2013.01); *H05K 1/0201* (2013.01); *H05K 1/0203* (2013.01); *H05K 1/0206* (2013.01); *H05K 1/0207* (2013.01); *H05K 3/0061* (2013.01); *H05K 2201/066* (2013.01)

(58) Field of Classification Search
CPC .... H05K 1/0203; H05K 1/0313; H05K 1/181; H05K 3/0061; H01L 23/36; H01L 23/3677; H01L 2924/0002
See application file for complete search history.

(56) References Cited

U.S. PATENT DOCUMENTS

| | | | |
|---|---|---|---|
| 2007/0262470 A1* | 11/2007 | Ichiryu | H01L 21/56 257/783 |
| 2010/0020499 A1 | 1/2010 | Lee et al. | |
| 2014/0190728 A1* | 7/2014 | Chou | H05K 3/002 174/252 |

OTHER PUBLICATIONS

English Translation of Chinese Search Report dated Jul. 3, 2018 for the related Chinese Patent Application No. 201580026095.7.

* cited by examiner

CIRCUIT BOARD

CROSS-REFERENCE TO RELATED APPLICATIONS

This application is a U.S. national stage application of the PCT International Application No. PCT/JP2015/002443 filed on May 14, 2015, which claims the benefit of foreign priority of Japanese patent application No. 2014-105867 filed on May 22, 2014, the contents all of which are incorporated herein by reference.

TECHNICAL FIELD

The present disclosure relates to a circuit board used in various electronic apparatuses.

BACKGROUND ART

FIG. 10 is a sectional view showing a configuration of a conventional circuit board 1. Circuit board 1 includes heat-dissipating plate 2, wiring board 5 disposed on heat-dissipating plate 2 and having resist layer 3 and resin layer 4, and heat generating component 6 mounted on wiring board 5. Resist layer 3 is provided on a surface facing heat-dissipating plate 2 in wiring board 5. Heat-dissipating plate 2 is formed of metal having high heat-dissipation property.

Furthermore, heat transfer portion 7 is provided in a part of resin layer 4 of wiring board 5 facing heat generating component 6. Heat transfer portion 7 is formed of metal having excellent heat transfer characteristics, and transmits heat generated by heat generating component 6 to heat-dissipating plate 2. Resist layer 3 electrically insulates heat transfer portion 7 from heat-dissipating plate 2.

CITATION LIST

Patent Literature

PTL 1: Japanese Patent Application Unexamined Publication No. 2007-19125

SUMMARY OF THE INVENTION

A circuit board in the present disclosure includes a heat storage body, an insulating layer, a wiring board, and a heat generating component. The insulating layer is disposed on the heat storage body. The wiring board is disposed to the insulating layer at an opposite side to the heat storage body. The heat generating component is disposed to the wiring board at an opposite side to the insulating layer. The insulating layer is provided independently of the wiring board. The wiring board is provided with a heat transfer metal portion penetrating through the wiring board and facing the heat generating component. The insulating layer is provided with a heat transfer resin portion penetrating through the insulating layer and facing the heat transfer metal portion. The heat transfer resin portion and a part of the insulating layer are interposed between the heat transfer metal portion and the heat storage body.

With this configuration, the heat transfer resin portion whose thickness dimension is stabilized by the insulating layer is interposed between the heat transfer metal portion and the heat storage body. Heat generated in the heat generating component is mainly transmitted from the heat transfer metal portion to the heat storage body via the heat transfer resin portion. As a result, while electrical insulation between heat transfer metal portion and the heat storage body is maintained, the heat transfer property from the heat transfer metal portion to the heat storage body is improved. Therefore, the heat generated in the heat generating component is efficiently absorbed by the heat storage body.

DESCRIPTION OF EMBODIMENTS

Figure 10:
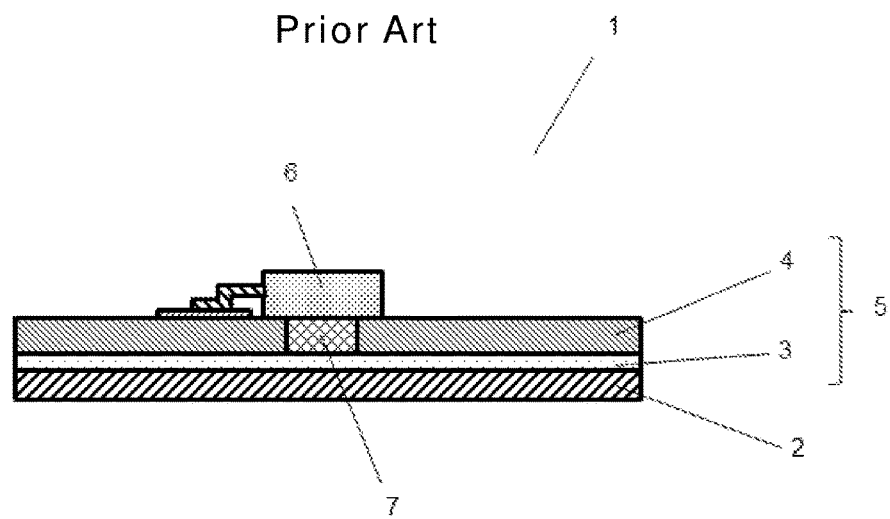
FIG. 10 is a sectional view of a conventional circuit board.

Prior to description of this exemplary embodiment, problems of a conventional circuit board 1 shown in FIG. 10 are described. In circuit board 1, resist layer 3 electrically insulates heat transfer portion 7 from heat-dissipating plate 2. Herein, resist layer 3 is applied to resin layer 4 and then hardened, and provided on the entire surface between resin layer 4 and heat-dissipating plate 2.

When resist layer 3 is thin, resist layer 3 has high heat transfer property from resin layer 4 to heat-dissipating plate 2, or high and stable heat transfer property from heat transfer portion 7 to heat-dissipating plate 2. However, when resist layer 3 is thin, resist layer 3 has many pin-holes. Therefore, insulation property between heat transfer portion 7 and heat-dissipating plate 2 may be lowered.

On the other hand, when resist layer 3 is thick, generation of pin-holes is suppressed, and accordingly resist layer 3 has excellent insulation property. However, when resist layer 3 is thick, variation in thickness of resist layer 3 easily occurs. Therefore, as the resist layer 3 is thicker, characteristics of heat transfer easily decrease and vary.

Figure 1:
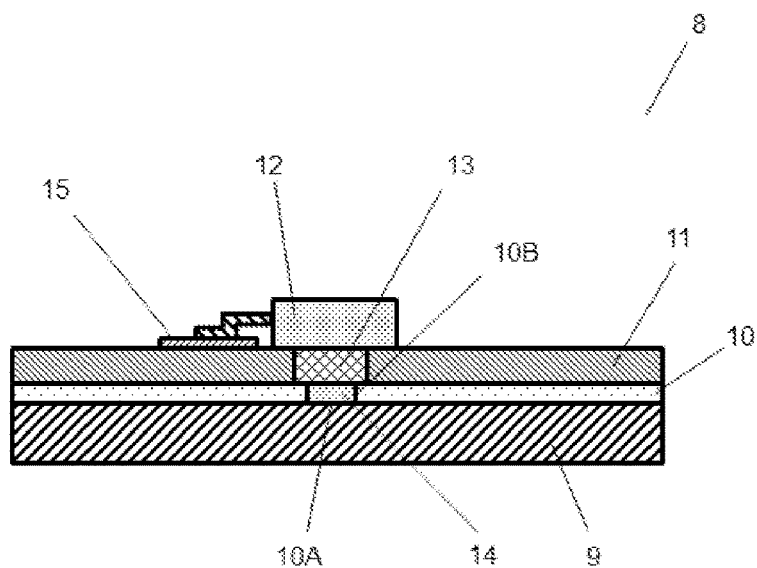
FIG. 1 is a sectional view of a circuit board in accordance with an exemplary embodiment.
Figure 2:
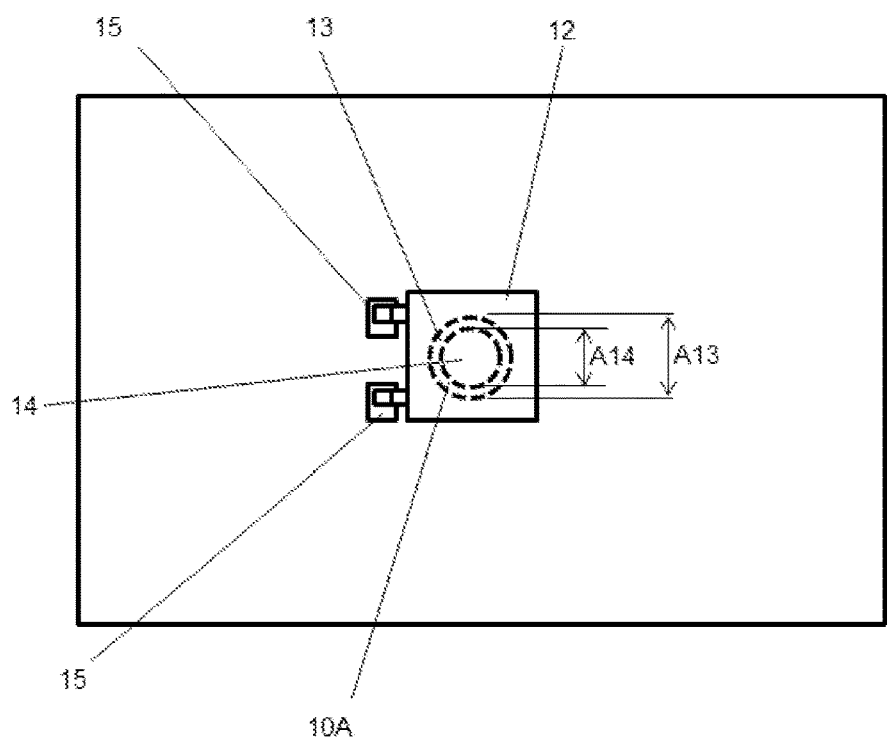
FIG. 2 is a top view of the circuit board shown in FIG. 1.

Hereinafter, the exemplary embodiment of the present disclosure is described with reference to drawings. FIG. 1 is a sectional view of circuit board 8 in accordance with this exemplary embodiment; FIG. 2 is a top view of circuit board 8.

Circuit board 8 includes heat storage body 9, insulating layer 10, wiring board 11, and heat generating component 12. Insulating layer 10 is disposed on heat storage body 9. Wiring board 11 is disposed to insulating layer 10 at an opposite side to heat storage body 9. Heat generating component 12 is disposed to wiring board 11 at an opposite side to insulating layer 10. Insulating layer 10 is provided independently of wiring board 11. Wiring board 11 is provided with heat transfer metal portion 13 penetrating through wiring board 11 and facing heat generating component 12. Insulating layer 10 is provided with heat transfer resin portion 14 penetrating through insulating layer 10 and facing heat transfer metal portion 13. Heat transfer resin portion 14 and a part of insulating layer 10 are interposed between heat transfer metal portion 13 and heat storage body 9.

With the above-mentioned configuration, heat transfer resin portion 14 is interposed between heat transfer metal portion 13 and heat storage body 9. The thickness dimension of heat transfer resin portion 14 is made stable by insulating layer 10. Heat generated in heat generating component 12 is mainly transmitted from heat transfer metal portion 13 to heat storage body 9 via heat transfer resin portion 14. As a result, while electrical insulation between heat transfer metal portion 13 and heat storage body 9 is maintained, the heat transfer property from heat transfer metal portion 13 to heat storage body 9 is improved. Therefore, the heat generated in heat generating component 12 is efficiently absorbed by heat storage body 9.

Hereinafter, a configuration of circuit board 8 is described in detail. Circuit board 8 includes heat storage body 9, insulating layer 10, wiring board 11, and heat generating component 12 mounted on wiring board 11, which are sequentially laminated.

Insulating layer 10 is provided with heat transfer resin portion 14, and wiring board 11 is provided with heat transfer metal portion 13. Heat transfer resin portion 14 faces and is in close contact with both heat storage body 9 and heat transfer metal portion 13. Heat transfer metal portion 13 faces and is in close contact with both heat transfer resin portion 14 and heat generating component 12. Thus, heat generating component 12 and heat storage body 9 are thermally bonded to each other.

Furthermore, heat transfer metal portion 13 and heat storage body 9 are electrically insulated from each other by heat transfer resin portion 14 and insulating layer 10. Thus, wiring pattern 15 and heat generating component 12 provided to wiring board 11 are electrically insulated from heat storage body 9. Therefore, heat storage body 9 may be formed of conductive substance.

Heat transfer metal portion 13 is formed by inserting a metal lump, which has been previously formed in a columnar or plate-like shape, into wiring board through-hole 11A provided in wiring board 11. Alternatively, heat transfer metal portion 13 may be a columnar or plate-like metal lump, which has been filled into or plated to wiring board through-hole 11A. Heat transfer metal portion 13 is desirably a material having high coefficient of thermal conductivity, for example, copper.

Heat transfer resin portion 14 may be disposed by filling insulating resin or by inserting insulating resin molded in advance into insulating layer through-hole 10A provided in insulating layer 10. As mentioned above, heat transfer resin portion 14 thermally bonds heat transfer metal portion 13 and heat storage body 9 to each other and electrically insulates heat transfer metal portion 13 and heat storage body 9 from each other. Therefore, it is desirable that insulating layer through-hole 10A have no air-gap and be completely filled with heat transfer resin portion 14. Furthermore, it is desirable that heat transfer resin portion 14 be obtained by filling insulating resin having a larger insulation resistance per unit volume than that of insulating layer 10 into insulating layer through-hole 10A provided in insulating layer 10.

Furthermore, heat transfer resin portion 14 is desirably in contact with both heat transfer metal portion 13 and heat storage body 9 with high adhesion such that heat transfer metal portion 13 and heat storage body 9 are thermally bonded to each other strongly. Therefore, heat transfer resin portion 14 is formed of easily deformable insulating resin having elastic modulus that is lower than that of heat storage body 9 and heat transfer metal portion 13. Furthermore, the elastic modulus of heat transfer resin portion 14 is lower than that of insulating layer 10. Heat transfer resin portion 14 is formed of easily deformable insulating resin.

Before heat transfer resin portion 14 is pressed by heat transfer metal portion 13 and wiring board 11 and by heat storage body 9, and before circuit board 8 is configured, heat transfer resin portion 14 may be provided such that it protrudes in the direction from insulating layer through-hole 10A to both heat transfer metal portion 13 and heat storage body 9. Then, insulating layer 10 and heat transfer resin portion 14 are pressed from both sides by heat transfer metal portion 13 and wiring board 11 and by heat storage body 9, so that heat transfer resin portion 14 may be disposed in insulating layer through-hole 10A so as to have substantially the same thickness dimension. As a result, a part of insulating layer 10 and at least a part of heat transfer resin portion 14 may be interposed in parallel between heat transfer metal portion 13 and heat storage body 9.

Thus, heat transfer resin portion 14 may be a material, which is in an unhardened and easily deformable in the initial state when it is filled in insulating layer through-hole 10A and then has adhesiveness so as to be in close contact with heat transfer metal portion 13 and heat storage body 9 after the resin is hardened. At this time, it is preferable that heat transfer resin portion 14 has thermal conductivity higher than that of insulating layer 10 such that heat transfer metal portion 13 and heat storage body 9 are thermally bonded to each other with high efficiency.

Therefore, heat transfer resin portion 14 may be filled into insulating layer through-hole 10A in an unhardened state in a volume larger than that of insulating layer through-hole 10A, and then hardened in a state in which it is pressed from both sides by heat transfer metal portion 13 and wiring board 11 and by heat storage body 9.

Naturally, firstly, heat transfer resin portion 14 is inserted into insulating layer through-hole 10A in an unhardened state in a volume larger than that of insulating layer through-hole 10A. After heat transfer resin portion 14 is hardened, heat transfer resin portion 14 may be pressed from both sides by heat transfer metal portion 13 and wiring board 11 and by heat storage body 9.

Furthermore, alternatively, heat transfer resin portion 14 is filled into insulating layer through-hole 10A in an unhardened state in a volume substantially similar to the volume of insulating layer through-hole 10A. Then, heat transfer resin portion 14 may be pressed from both sides by heat transfer metal portion 13 and wiring board 11 and by heat storage body 9 after heat transfer resin portion 14 is hardened.

Insulating layer 10 is provided independently of wiring board 11. In other words, insulating layer 10 is not formed after it is applied to surfaces of wiring board 11 or heat storage body 9, but it is disposed as a plate-shaped or film-shaped insulating body which is inserted and sandwiched between heat storage body 9 and wiring board 11. Since insulating layer 10 is disposed as a separate body from wiring board 11 and heat storage body 9, insulating layer 10 can be easily disposed in any position relation with respect to wiring board 11.

Although not shown, wiring board 11, insulating layer 10 and heat storage body 9 may be fixed by a fixing member such as a screw. Thus, insulating layer 10 is fixed in a state in which it is sandwiched between wiring board 11 and heat storage body 9. Insulating layer 10 electrically insulates wiring board 11 from heat storage body 9, and allows heat transfer resin portion 14 to have a stable thickness dimension. Therefore, insulating layer 10 is in close contact with wiring board 11 and heat storage body 9 not necessarily over the entire surfaces thereof.

Furthermore, wiring board 11, insulating layer 10 and heat storage body 9 may be fixed to heat transfer resin portion 14 with an adhesive agent (not shown). Also in this case, insulating layer 10 is adhesively bonded to wiring board 11 and heat storage body 9 not necessarily over the entire surfaces thereof.

Consequently, insulating layer through-hole wall 10B and heat transfer resin portion 14 can be easily disposed in any position relation with respect to wiring board 11 or heat transfer metal portion 13. In other words, the position of insulating layer 10 is easily determined such that the neighboring portion of insulating layer through-hole wall 10B that is a part of insulating layer 10 and an entire or a part of heat transfer resin portion 14 are disposed in parallel between heat transfer metal portion 13 and heat storage body 9.

Furthermore, a distance between heat transfer metal portion 13 and heat storage body 9 is determined by a thickness dimension of insulating layer 10 because the elastic modulus of heat transfer resin portion 14 is lower than that of insulating layer 10. Since insulating layer 10 is previously formed in a form of a film or a plate, insulating layer 10 has high thickness dimension accuracy with less variation. Therefore, characteristics of heat conduction from heat transfer metal portion 13 to heat storage body 9, and characteristics of insulation between heat transfer metal portion 13 and heat storage body 9 can be arbitrarily set based on the thickness dimension of insulating layer 10.

As mentioned above, the thickness dimension of heat transfer resin portion 14 based on the thickness dimension of insulating layer 10 can be set with higher accuracy when a part of insulating layer 10 is interposed between heat transfer metal portion 13 and heat storage body 9.

Furthermore, in a region in which heat transfer metal portion 13 faces heat storage body 9, insulating layer 10 is interposed only in a limited part. Meanwhile, in the other region in which heat transfer metal portion 13 faces heat storage body 9, not insulating layer 10 but heat transfer resin portion 14 is interposed. Heat transfer resin portion 14 has more excellent electrical insulation property than that of insulating layer 10. Therefore, in particular, even when insulating layer 10 is a material that is extremely thin and pin-holes and the like are easily generated, since a region in which insulating layer 10 is interposed is limited, decrease of the insulation property between heat transfer metal portion 13 and heat storage body 9 is suppressed. The characteristics of insulation and thermal conductivity are further improved when a region in which heat transfer resin portion 14 is interposed is larger than a region in which insulating layer 10 is interposed between heat transfer metal portion 13 and heat storage body 9.

Materials for insulating layer 10 may preferably include polyethylene naphthalate having high heat resistance and capable of being formed with uniform thickness regardless of sites. The other materials for insulating layer 10 may include polyethylene terephthalate or polyimide resin. Materials for heat transfer resin portion 14 may preferably include silicone rubber or a silicone compound having high insulation property. Inorganic filler having high thermal conductivity may be blended with heat transfer resin portion 14. For the inorganic filler, metal compounds such as alumina and silica may be used.

From the above, an area ratio between insulating layer 10 and heat transfer resin portion 14, which are interposed between heat transfer metal portion 13 and heat storage body 9, is easily determined from the positional relation between insulating layer 10 and wiring board 11. In other words, since the thickness of insulating layer 10 is determined in advance, a volume ratio between insulating layer 10 and heat transfer resin portion 14, which are interposed between heat transfer metal portion 13 and heat storage body 9, is easily determined. As a result, the characteristics of heat conduction from heat transfer metal portion 13 to heat storage body 9 or the characteristics of insulation between heat transfer metal portion 13 and heat storage body 9 are set finely and easily.

In addition, as shown in FIG. 2, both heat transfer resin portion 14 and heat transfer metal portion 13 are formed in a columnar, or cylindrical or disk-like shape, and outer diameter A14 in the penetrating direction of heat transfer resin portion 14 is preferably made smaller than outer diameter A13 in the penetrating direction of heat transfer metal portion 13. Thus, between heat transfer metal portion 13 and heat storage body 9, insulating layer 10 is easily disposed facing the peripheral edge of heat transfer metal portion 13. Accordingly, an area in which heat transfer resin portion 14 and heat transfer metal portion 13 face each other does not vary easily. Then, heat transfer resin portion 14 is easily interposed with the thickness uniform over the entire part between heat transfer metal portion 13 and heat storage body 9. As a result, the characteristics of heat conduction from heat transfer metal portion 13 to heat storage body 9 or the characteristics of insulation between heat transfer metal portion 13 and heat storage body 9 become stable.

Outer diameter A14 in the penetrating direction of heat transfer resin portion 14 is preferably encompassed by outer diameter A13 in the penetrating direction of heat transfer metal portion 13. Thus, an area in which heat transfer resin portion 14 and heat transfer metal portion 13 face each other does not vary easily. Furthermore, the thickness of heat transfer resin portion 14 is substantially uniform over the entre part. As a result, the characteristics of heat conduction from heat transfer metal portion 13 to heat storage body 9 or the characteristics of insulation between heat transfer metal portion 13 and heat storage body 9 are further stabilized.

In other words, insulating layer through-hole 10A and wiring board through-hole 11A are preferably formed in a concentric circle. Thus, even when heat transfer metal portion 13 has recess and protrusion on a surface facing heat transfer resin portion 14, the characteristics of heat conduction and insulation become stable.

Figure 3:
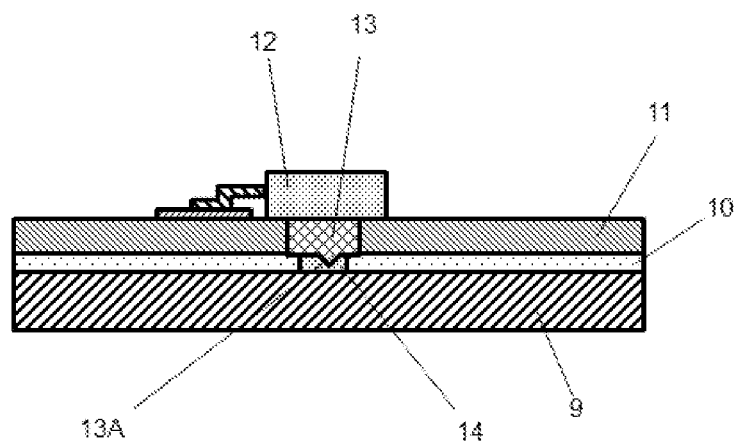
FIG. 3 is a sectional view of a circuit board using another heat transfer metal portion in accordance with the exemplary embodiment.

FIG. 3 is a sectional view of circuit board 8 using another heat transfer metal portion 13 in accordance with this exemplary embodiment. As shown in FIG. 3, when heat transfer metal portion 13 has protrusion 13A in the direction to heat transfer resin portion 14, insulating layer 10 that is more rigid than heat transfer resin portion 14 holds the peripheral edge of heat transfer metal portion 13. Then, heat transfer metal portion 13 and heat storage body 9 maintain appropriate position relation. Therefore, when a protruding dimension of protrusion 13A is smaller than the thickness of insulating layer 10, the characteristics of insulation between heat transfer metal portion 13 and heat storage body 9 can be maintained. Herein, although the thickness of heat transfer resin portion 14 is partially smaller, since the insulation property of heat transfer resin portion 14 is higher than that of insulating layer 10, a large problem on the insulation property does not occur.

Herein, a case where a part of heat transfer metal portion 13 protrudes as protrusion 13A is shown. Alternatively, a plurality of protrusions 13A protrudes such that the surface on which heat transfer metal portion 13 faces heat transfer resin portion 14 has a large number of recesses and protrusions.

Alternatively, also in a case where an entire part of heat transfer metal portion 13 protrudes in the direction from the lower surface of wiring board 11 toward heat transfer resin portion 14 in the drawing, insulating layer 10 that is more rigid than heat transfer resin portion 14 holds a peripheral edge of heat transfer metal portion 13. Then, heat transfer metal portion 13 and heat storage body 9 maintain appropriate position relation. Therefore, regardless of the amount of protrusion of heat transfer metal portion 13, characteristics of insulation between heat transfer metal portion 13 and heat storage body 9 can be maintained.

Insulating layer through-hole 10A and wiring board through-hole 11A of FIG. 2 are shown in a shape approximate to substantially a perfect circle seen in the top view, for convenience of description. However, the shapes of insulating layer through-hole 10A and wiring board through-hole 11A may be a polygon or a broken-hole circle whose outer circumference is deformed in a wave shape.

Although not shown herein, when heat generating component 12 is used as a field-effect transistor (FET) or the like in a converter or an inverter, a plurality of heat generating components 12 is disposed in such a manner they are distributed in the distant positions. At this time, usually, a plurality of heat generating components 12 having the same or similar characteristics is disposed. Herein, as mentioned above, wiring board 11 and heat storage body 9 are disposed via insulating layer 10. Insulating layer 10 is disposed as an individual element, provided separately from wiring board 11 and heat storage body 9, and having substantially a stable and uniform thickness dimension. Therefore, thicknesses of individual heat transfer resin portions 14 corresponding to individual heat generating components 12 or insulation property and thermal conductivity based thereon are equalized. Therefore, it is less likely that a temperature of a part of heat generating components 12 is increased unevenly and operations of the converter or the inverter become unstable.

In the above, mainly, a part of insulating layer 10 is interposed between wiring board 11 and heat storage body 9 based on the outer diameters of insulating layer through-hole 10A and wiring board through-hole 11A, and thereby insulation property and thermal conductivity of wiring board 11 and heat storage body 9 is set. Other than this, insulating layer through-hole 10A and wiring board through-hole 11A are formed in different shapes, and thereby insulation property and thermal conductivity of wiring board 11 and heat storage body 9 may be set. Hereinafter, description with examples are given.

Figure 4:
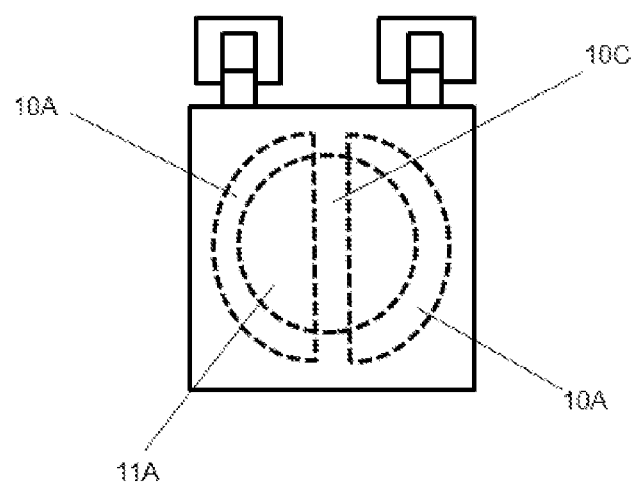
FIG. 4 is a top view of a principal part of a circuit board using another insulating layer in accordance with the exemplary embodiment.
Figure 5:
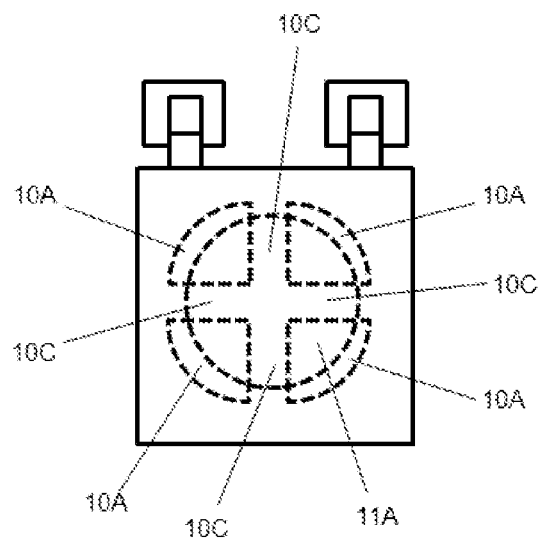
FIG. 5 is a top view of a principal part of a circuit board using a still another insulating layer in accordance with the exemplary embodiment.

FIG. 4 is a top view of a principal part of circuit board 8 using another insulating layer 10 in accordance with this exemplary embodiment. FIG. 5 is a top view of a principal part of circuit board 8 using a still another insulating layer 10 in accordance with this exemplary embodiment. As shown in FIGS. 4 and 5, insulating layer through-hole 10A may have a shape divided into a plurality of parts by through-hole beam portion(s) 10C. In FIG. 4, insulating layer through-hole 10A is divided into two parts by through-hole beam portion 10C, and in FIG. 5, insulating layer through-hole 10A is divided into four parts by a plurality of through-hole beam portions 10C. Herein, any of insulating layer through-hole 10A and wiring board through-hole 11A may have a larger outer diameter or both have the equal outer diameters.

Thus, through-hole beam portion 10C that is a part of insulating layer 10 is always easily interposed between heat transfer metal portion 13 and heat storage body 9. Through-hole beam portion 10C has a thickness dimension similar to that of insulating layer 10, and determines the interval between heat transfer metal portion 13 and heat storage body 9. Thus, heat transfer resin portion 14 is provided in the divided insulating layer through-holes 10A, has substantially equal thickness to that of insulating layer 10, and is interposed between heat transfer metal portion 13 and heat storage body 9.

Since through-hole beam portion 10C is easily disposed in the center or near the center of insulating layer through-hole 10A, the thickness of heat transfer resin portion 14 is substantially uniform over the entire part. As a result, the characteristics of heat conduction and insulation between heat transfer metal portion 13 and heat storage body 9 become stable. Furthermore, through-hole beam portion 10C may not be disposed necessarily in the center of wiring board through-hole 11A. In such a case, an area in which heat transfer resin portion 14 faces heat transfer metal portion 13 and heat storage body 9 is not easily changed. As a result, the characteristics of heat conduction and insulation of heat transfer resin portion 14 between heat transfer metal portion 13 and heat storage body 9 become stable.

Furthermore, in order to stabilize the characteristics of heat conduction and insulation of heat transfer resin portion 14, the outer diameter of circular insulating layer through-hole 10A is preferably larger than the outer diameter of circular wiring board through-hole 11A. This makes an area of heat transfer resin portion 14 in the penetrating axial direction larger, and therefore, the characteristics of heat conduction and insulation are improved. Furthermore, since through-hole beam portion 10C is disposed so as to determine the interval between heat transfer metal portion 13 and heat storage body 9, the width of through-hole beam portion 10C can be easily set to a small value. Consequently, heat transfer resin portion 14 easily faces heat transfer metal portion 13 with a larger area, thus improving the effect on the heat conduction or the insulation property.

Furthermore, the center of insulating layer through-hole 10A and the center of wiring board through-hole 11A may be displaced from each other. Herein, the value of displacement of the centers between insulating layer through-hole 10A and wiring board through-hole 11A is only required to be smaller than the value of difference between the outer diameter of insulating layer through-hole 10A and the outer diameter of wiring board through-hole 11A. Thus, an area in which heat transfer metal portion 13 faces heat storage body 9 via heat transfer resin portion 14 is substantially constant. As a result, the characteristics of heat conduction and insulation of heat transfer resin portion 14 between heat transfer metal portion 13 and heat storage body 9 become stable.

In the above description, both insulating layer through-hole 10A and wiring board through-hole 11A have basically circular shapes. However, one of insulating layer through-hole 10A and wiring board through-hole 11A may not have basically circular, or both may not have basically circular.

Figure 6:
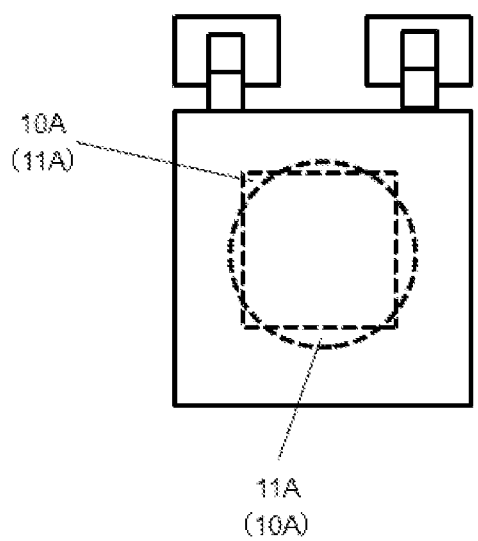
FIG. 6 is a top view of a principal part of a circuit board using a yet another insulating layer in accordance with the exemplary embodiment.

FIG. 6 is a top view of a principal part of circuit board 8 using a yet another insulating layer 10 in accordance with this exemplary embodiment. The outer shape of insulating layer through-hole 10A seen in the penetrating direction may be made to be square, and the outer shape of wiring board through-hole 11A seen in the penetrating direction may be made to be circular. Herein, the dimension of each side of the square insulating layer through-hole 10A is smaller than the diameter of wiring board through-hole 11A.

Thus, heat transfer metal portion 13 and heat storage body 9 face each other via a part of insulating layer 10 and a part of heat transfer resin portion 14 disposed in insulating layer through-hole 10A. As a result, the thickness of heat transfer resin portion 14 is substantially uniform over the entire part. The characteristics of heat conduction from heat transfer metal portion 13 to heat storage body 9 and the characteristics of insulation property between heat transfer metal portion 13 and heat storage body 9 become stable.

Furthermore, the outer shape of insulating layer through-hole 10A seen in the penetrating direction may be made circular, and the outer shape of wiring board through-hole 11A seen in the penetrating direction may be made to be square. Herein, the diameter dimension of circular insulating layer through-hole 10A is smaller than the diagonal dimension of square wiring board through-hole 11A.

Thus, heat transfer metal portion 13 and heat storage body 9 face each other via a part of insulating layer 10 and a part of heat transfer resin portion 14 disposed in insulating layer through-hole 10A. As a result, the thickness dimension of heat transfer resin portion 14 becomes stable, and the characteristics of heat conduction from heat transfer metal portion 13 to heat storage body 9 and the characteristics of insulation between heat transfer metal portion 13 and heat storage body 9 become stable.

Figure 7:
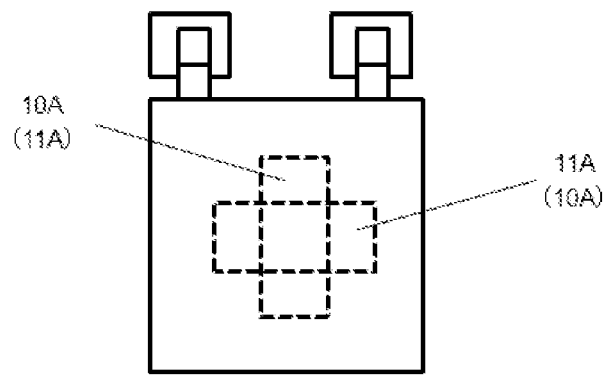
FIG. 7 is a top view of a principal part of a circuit board using a further insulating layer in accordance with the exemplary embodiment.

FIG. 7 is a top view of a principal part of circuit board 8 using a further insulating layer 10 in accordance with this exemplary embodiment. In FIG. 7, the outer shape of insulating layer through-hole 10A seen in the penetrating direction is a rectangle whose longitudinal direction in the drawing is a major axis. The outer shape of wiring board through-hole 11A seen in the penetrating direction is a rectangle whose lateral direction in the drawing is a major axis. In other words, insulating layer through-hole 10A and wiring board through-hole 11A are rectangles whose major axes cross over each other. Insulating layer through-hole 10A and wiring board through-hole 11A may be formed in this way.

Thus, even when an angle or a position when insulating layer 10 and wiring board 11 are laminated onto each other is changed, areas in which insulating layer through-hole 10A and wiring board through-hole 11A overlap one another are hardly changed. Thus, heat transfer metal portion 13 faces heat storage body 9 via a part of insulating layer 10 and a part of heat transfer resin portion 14 disposed in insulating layer through-hole 10A. As a result, the thickness of heat transfer resin portion 14 is substantially uniform over the entire part. The characteristics of heat conduction from heat transfer metal portion 13 to heat storage body 9 and the characteristics of insulation between heat transfer metal portion 13 and heat storage body 9 become stable.

Herein, heat storage body 9 is configured mainly for the purpose of absorbing heat generated in heat generating component 12 rather than dissipating heat generated in heat generating component 12. For example, when a power source device (not shown) using circuit board 8 operates as an emergency power source to compensate for a momentary change in voltage, the power source device does not operate continuously for a long time, but it operates intensively for a short and limited time. Therefore, temperature in heat generating component 12 of circuit board 8 is suddenly increased. In order to rapidly absorb the heat generated in heat generating component 12 via heat transfer metal portion 13 and heat transfer resin portion 14, heat storage body 9 preferably has heat capacity larger than heat capacity of heat generating component 12, or heat capacity larger than an amount of heat generated in heat generating component 12. Thus, heat generating component 12 can intensively repeat an operation required for a short time.

Heat storage body 9 is preferably formed of a material having high coefficient of thermal conductivity, for example, copper and aluminum. Thus, heat quickly propagates from a portion in which heat transfer resin portion 14 is in contact with heat storage body 9 to the entire part of heat storage body 9, and heat storage body 9 absorbs heat rapidly.

Furthermore, the heat capacity of heat storage body 9 mentioned above may be equivalent to the amount of heat generated from heat generating component 12 when all the electric power of a storage battery (not shown) connected to the power source device using circuit board 8 is consumed. Alternatively, the heat capacity of heat storage body 9 may be determined based on the amount of heat generated from heat generating component 12 when the electric power of the storage battery is consumed. In the drawing, heat generating component 12 is singly disposed to wiring board 11. However, when a plurality of heat generating components 12 is disposed, the heat capacity of heat storage body 9 may be equivalent to the total sum of the amount of heat generated from heat generating components 12.

In FIGS. 1 and 3, heat storage body 9 is formed in a plate shape using copper or aluminum as mentioned above. Heat storage body 9 is configured to preferentially absorb heat from heat generating component 12 rather than dissipating heat.

Figure 8:
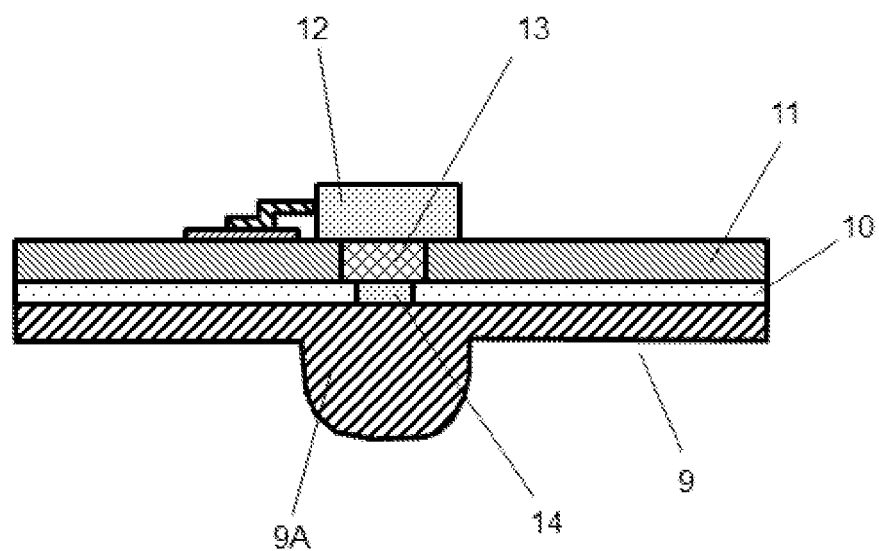
FIG. 8 is a sectional view of a circuit board using another heat storage body in accordance with the exemplary embodiment.

Therefore, heat storage body 9 may be formed as shown in FIG. 8. FIG. 8 is a sectional view of circuit board 8 using another heat storage body 9 in accordance with this exemplary embodiment. In FIG. 8, heat storage body 9 is not a plate having a uniform thickness, but heat storage body 9 has bump-shaped or lump-shaped heat storage portion 9A at a portion confronting heat transfer resin portion 14.

Thus, in heat storage body 9, heat capacity becomes larger in a region in which heat from heat generating component 12 easily propagates. Furthermore, heat storage portion 9A has a larger cross-sectional area in the direction in which heat propagates as compared with a plate portion of heat storage body 9. Therefore, since thermal resistance for allowing heat to propagate becomes smaller in heat storage portion 9A, it is possible to absorb the heat from heat generating component 12 rapidly. When a plurality of heat generating components 12 is disposed on wiring board 11, heat storage portions 9A having substantially the same shape may be provided corresponding to individual heat generating components 12. Furthermore, the heat capacity of individual heat storage portion 9A may be equivalent to the amount of heat generated from heat generating component 12 or heat capacity of heat generating component 12.

In addition, although not shown in FIGS. 1 and 3, recess and protrusion may be provided to heat storage body 9 at a portion in which heat storage body 9 faces heat transfer resin portion 14. As mentioned above, heat storage body 9 is configured mainly for the purpose of absorbing heat generated in heat generating component 12 rather than dissipating heat. Therefore, heat transmitted from heat generating component 12 to heat storage body 9 via heat transfer metal portion 13 and heat transfer resin portion 14 is preferably absorbed by heat storage body 9 for a short time. Thus, a contact area between heat storage body 9 and heat transfer resin portion 14 is preferably made larger. This permits smooth heat transfer from heat generating component 12 to heat storage body 9.

Furthermore, when a plurality of heat generating components 12 is disposed on wiring board 11, recesses and protrusions may be provided to heat storage body 9 at a portion in which heat transfer resin portions 14 face individual heat generating components 12. The recesses and protrusions corresponding to individual heat generating components 12 formed herein may have substantially the same shapes.

Figure 9:
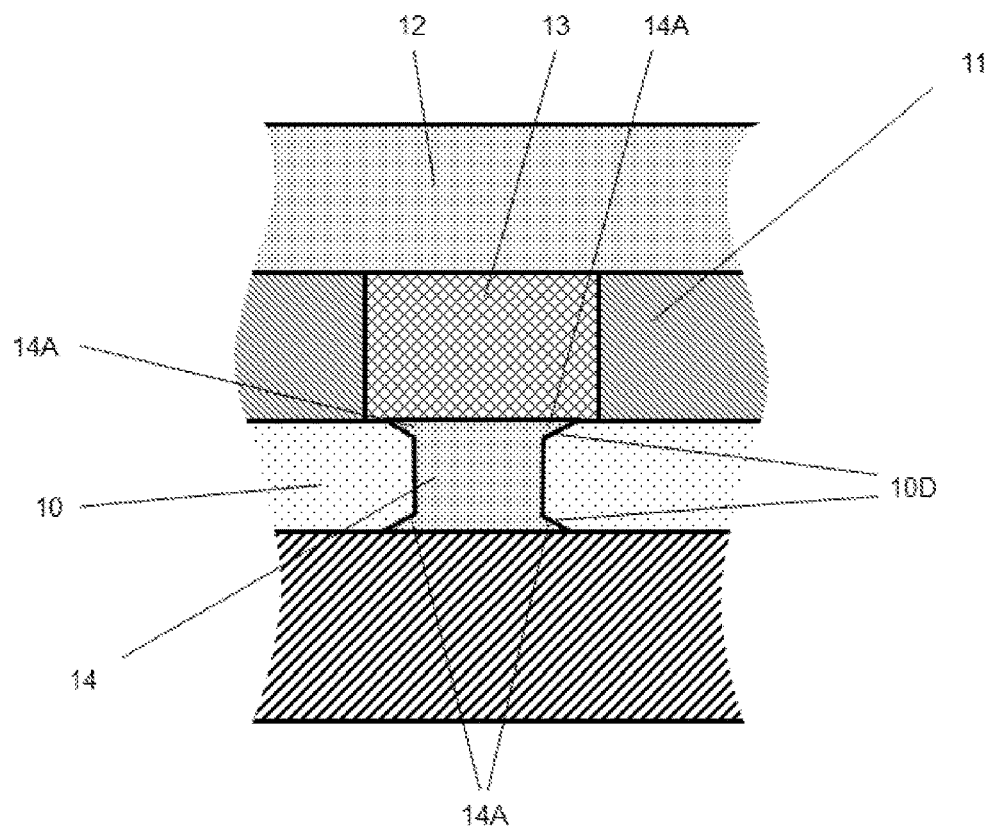
FIG. 9 is a sectional view of a principal part of a circuit board using another heat transfer resin portion in accordance with the exemplary embodiment.

FIG. 9 is a sectional view of a principal part of circuit board 8 using another heat transfer resin portion 14 in accordance with the exemplary embodiment. Heat transfer resin portion 14 has a columnar, or cylindrical or disk-like shape. In addition, in a portion in which heat transfer resin portion 14 faces heat transfer metal portion 13 and a portion in which heat transfer resin portion 14 faces heat storage body 9, resin flange portion 14A may be provided on the entire circumference or on a part of the outer circumference. In other words, heat transfer resin portion 14 may be formed in a shape of rivet. Thus, a creeping distance between heat transfer metal portion 13 and heat storage body 9 is increased, and insulation property between heat transfer metal portion 13 and heat storage body 9 is improved. Resin flange portion 14A is formed in the upper and lower surfaces of heat transfer resin portion 14 in the drawing, but resin flange portion 14A may be one of the upper surface or the lower surface.

Furthermore, resin flange portion 14A may be formed corresponding to cut-away portion 10D which is previously provided in insulating layer 10. This allows the creeping distance between heat transfer metal portion 13 and heat storage body 9 to be stable, thus stabilizing the insulation property between heat transfer metal portion 13 and heat storage body 9.

Alternatively, as mentioned above, before insulating layer 10 is sandwiched between wiring board 11 and heat storage body 9, heat transfer resin portion 14 is firstly disposed such that it protrudes from insulating layer through-hole 10A. Thereafter, heat transfer resin portion 14 is pressed by heat transfer metal portion 13 and heat storage body 9 from the upper and lower sides in the drawing. As a result, a part of heat transfer resin portion 14 presses insulating layer 10, and resin flange portion 14A may be formed in the upper and lower surfaces of heat transfer resin portion 14. At this time, cut-away portion 10D may be formed or may not be formed.

INDUSTRIAL APPLICABILITY

As mentioned above, according to the present disclosure, while electrical insulation between a heat transfer metal portion and a heat storage body is maintained, heat transfer property from the heat transfer metal portion to the heat storage body is improved. Therefore, the present disclosure provides an advantageous effect that heat generated in a heat generating component is efficiently absorbed by a heat storage body, and is useful for a circuit board.

The invention claimed is:

1. A circuit board comprising:
   a heat storage body;
   an insulating layer disposed on the heat storage body;
   a wiring board disposed to the insulating layer at an opposite side to the heat storage body; and
   a heat generating component disposed to the wiring board at an opposite side to the insulating layer,
   wherein the insulating layer is provided independently of the wiring board,
   the wiring board is provided with a heat transfer metal portion penetrating through the wiring board and facing the heat generating component,
   the insulating layer is provided with a heat transfer resin portion penetrating through the insulating layer and facing the heat transfer metal portion, the heat transfer resin portion having a higher electrical insulation property than the insulating layer, and
   the heat transfer resin portion and a part of the insulating layer are interposed between the heat transfer metal portion and the heat storage body,
   wherein both the heat transfer metal portion and the heat transfer resin portion are formed in a cylindrical shape,
   an outer diameter in a penetrating direction of the heat transfer resin portion is smaller than an outer diameter in a penetrating direction of the heat transfer metal portion.

2. The circuit board of claim 1, wherein the heat transfer resin portion is in close contact with the heat transfer metal portion and the heat storage body.

3. The circuit board of claim 1, wherein an outer peripheral shape in a penetrating direction of the heat transfer resin portion is different from an outer peripheral shape in the penetrating direction of the heat transfer metal portion.

* * * * *